(12) United States Patent
Morrison et al.

(10) Patent No.: US 8,383,323 B2
(45) Date of Patent: Feb. 26, 2013

(54) SELECTIVE IMAGING THROUGH DUAL PHOTORESIST LAYERS

(75) Inventors: Pedro Morrison, Austin, TX (US); Kevin Soukup, Austin, TX (US); David Cho, Austin, TX (US); Karla Mendoza, Austin, TX (US)

(73) Assignees: Samsung Austin Semiconductor, L.P., Austin, TX (US); Samsung Electronics Co., Ltd., Suwon-si (KR)

( * ) Notice: Subject to any disclaimer, the term of this patent is extended or adjusted under 35 U.S.C. 154(b) by 782 days.

(21) Appl. No.: 11/520,425

(22) Filed: Sep. 13, 2006

(65) Prior Publication Data

US 2008/0076068 A1     Mar. 27, 2008

(51) Int. Cl.
     *G03F 7/20*      (2006.01)
(52) U.S. Cl. ....................................................... 430/311
(58) Field of Classification Search .................. 430/322, 430/311, 394
See application file for complete search history.

(56) References Cited

U.S. PATENT DOCUMENTS

| | | | | |
|---|---|---|---|---|
| 5,082,762 | A * | 1/1992 | Takahashi | 430/296 |
| 7,229,745 | B2 * | 6/2007 | Lamarre | 430/313 |
| 2002/0122918 | A1 * | 9/2002 | Dentinger et al. | 428/138 |
| 2002/0132189 | A1 * | 9/2002 | Huang et al. | 430/312 |
| 2003/0092224 | A1 * | 5/2003 | Hwang et al. | 438/151 |
| 2004/0005507 | A1 * | 1/2004 | Lakkapragada et al. | 430/30 |
| 2004/0048201 | A1 * | 3/2004 | Sato | 430/311 |
| 2004/0191927 | A1 | 9/2004 | Park et al. | |

FOREIGN PATENT DOCUMENTS

| | | |
|---|---|---|
| JP | 07-142309 | 6/1995 |
| JP | 09-115899 | 5/1997 |
| KR | 1019990056767 A | 7/1999 |
| KR | 1020040083709 A | 10/2004 |
| KR | 1020060011734 A | 2/2006 |

* cited by examiner

*Primary Examiner* — Brittany Raymond

(57) ABSTRACT

A system and method for selective imaging through dual photoresist layers. The system and method includes coating a surface of the wafer with a first resist and baking the wafer to sufficiently drive out solvents in the first resist. The first resist is exposed to a first radiation source and exposing an edge of the wafer having the first resist disposed thereon to the first radiation source. The method further includes hard baking the first resist to the wafer and coating the first resist with a second resist. The method also includes baking the wafer to sufficiently drive out solvents in the second resist and exposing the second resist to a second radiation source. The method also includes exposing select portions of the edge of the wafer having the second resist disposed thereon to the second radiation source and hard baking the second resist to the wafer.

20 Claims, 4 Drawing Sheets

SELECTIVE IMAGING THROUGH DUAL PHOTORESIST LAYERS

TECHNICAL FIELD OF THE INVENTION

The present disclosure relates generally to the field of photolithography and more specifically to selective imaging.

BACKGROUND OF THE INVENTION

Photolithography is the transfer of a pattern to a photosensitive material by selective exposure to a radiation source such as, for example, light. A photosensitive material generally experiences a change in its material property when exposed to a radiation source. Typically, a photosensitive material includes a photoresist polymer or resist. After a resist is exposed to a radiation source of a specified wavelength and a developer solution, the chemical resistance of the resist changes and the resist will etch away either the exposed or unexposed regions, depending on the chemical properties of the resist and the developer solution. For example, if the exposed material is etched away by the developer and the unexposed region is resilient, the material is considered a positive resist. On the other hand, if the exposed material is resilient to the developer and the unexposed region is etched away, the material is considered a negative resist. Using the properties of the resist and the developer, patterns may be etched onto the surface of a wafer. Moreover, patterns may be used as a template for depositing materials after lithography. At the end of the process, the resist is typically etched away and any materials deposited on the resist is also etched away. Resists, however, cannot withstand high temperatures and may act as a source of contamination. Often times, etching near the edge of the wafer is simply not possible or not etched adequately within system parameters.

In most applications, the lithography process typically follows several standard steps to ensure that a wafer is etched accurately. For example, the lithography process typically includes preparing the surface of the wafer by baking the wafer to ensure that the resist will adhere properly. Some applications require that the wafer surface be prepared with an adhesion promoter. The wafer is spinned or sprayed uniformly with the resist and then soft baked to remove some of the solvent in the resist, making the resist more viscous. The wafer is typically aligned with a mask, selectively exposed to a radiation source and then baked again. Then, the wafer is exposed to a developer to selectively remove the resist. Finally, the wafer is typically hard baked to drive off more of the solvent in the resists and any resist residue is removed.

Prior art systems and methods, however, have failed to employ systems to enhance performance on the edge of the wafer. Even after selective imaging, prior systems often waste valuable wafer surface space (i.e., wafer edges) and are tedious and time consuming. Accordingly, the images were, at best, placed without taking into account most imaging practices, especially near the edge of the wafer. In addition, selective hard masking is currently accomplished by performing a photo process, an etch process, an ash or strip process. Often times, prior practices led to incomplete nodes and thus, the percentage of operational devices manufactured, or "yield", is relatively low or simply unacceptable.

What is needed therefore is an improved, low cost method for hard masking wafers, including wafer edges.

SUMMARY OF THE INVENTION

The present disclosure provides an improved, low cost method for hard masking wafers including wafer edges, and in particular, system and method for selective imaging through dual photoresist layers.

In one embodiment, a method of selectively hard masking a semiconductor wafer is disclosed. The method includes coating a surface of the wafer with a first resist and baking the wafer to sufficiently drive out solvents in the first resist. The method also includes exposing the first resist to a first radiation source and exposing an edge of the wafer having the first resist disposed thereon to the first radiation source. The method further includes hard baking the first resist to the wafer and coating the first resist with a second resist. The method still further includes baking the wafer to sufficiently drive out solvents in the second resist and exposing the second resist to a second radiation source. The method still further includes exposing select portions of the edge of the wafer having the second resist disposed thereon to the second radiation source and hard baking the second resist to the wafer.

In another embodiment, a method of selective imaging through a dual photoresist layer for use in a semiconductor wafer is disclosed. The method includes coating a surface of the wafer with a resist and baking the wafer to sufficiently drive out solvents in the resist. The method also includes exposing the resist to a first radiation source and hard baking the resist to the wafer. The method further includes exposing the wafer to a high hot plate and coating the resist with a photosensitive polymer. The method still further includes baking the wafer to sufficiently drive out solvents in the photosensitive polymer and exposing the photosensitive polymer to an ultraviolet radiation source. The method also includes hard baking the photosensitive polymer to the wafer.

In still another embodiment, a semiconductor wafer is disclosed. The semiconductor wafer includes a surface and a first resist selectively disposed on the surface. The semiconductor wafer also includes a second resist selectively disposed and hard baked onto the first resist.

Other features and advantages of the present disclosure will be apparent to those of ordinary skill in the art upon reference to the following detailed description taken in conjunction with the accompanying drawings.

BRIEF DESCRIPTION OF THE DRAWINGS

For a better understanding of the disclosure, and to show by way of example how the same may be carried into effect, reference is now made to the detailed description of the disclosure along with the accompanying figures in which corresponding numerals in the different figures refer to corresponding parts and in which.

DETAILED DESCRIPTION OF THE INVENTION

While the making and using of various embodiments of the present disclosure are discussed in detail below, it should be appreciated that the present disclosure provides many applicable inventive concepts, which can be embodied in a wide variety of specific contexts. Although described in relation to such apparatus and methods, the teachings and embodiments of the present disclosure may be beneficially implemented with a variety of manufacturing and applications. The specific embodiments discussed herein are, therefore, merely demonstrative of specific ways to make and use the disclosure, and do not limit the scope of the disclosure.

Figure 1:
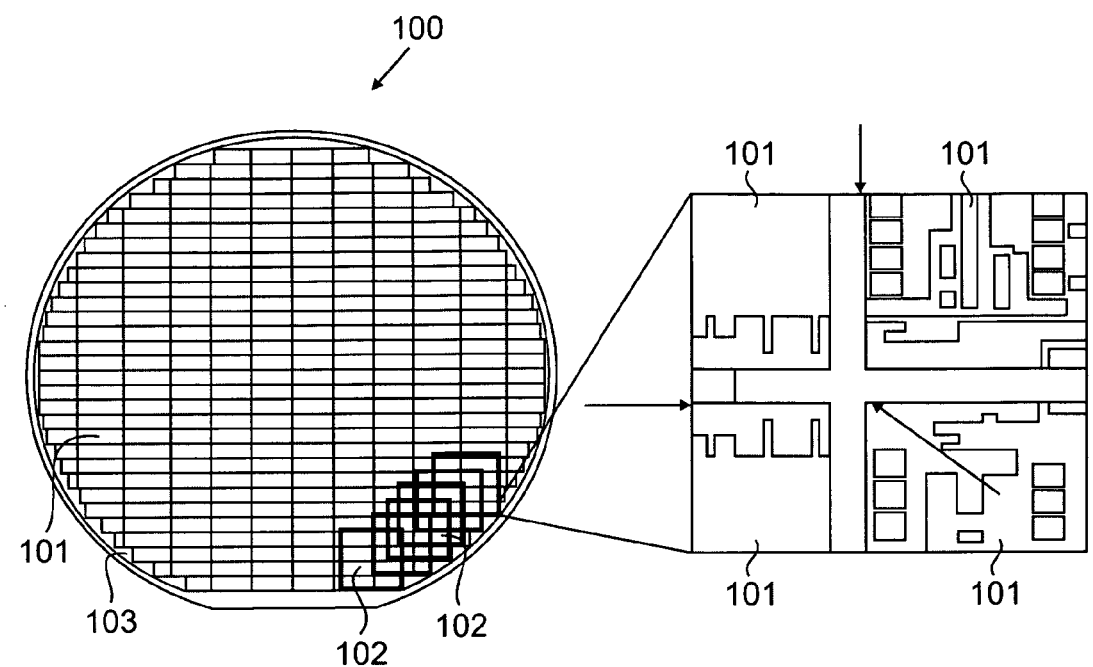
FIG. 1 depicts a coated wafer with a mask image in accordance with one embodiment of the present disclosure.

FIG. 1 depicts a coated wafer 100 with a mask image in accordance with one embodiment of the present disclosure, and specifically a wafer 100 resulting from the first phase of the method disclosed later herein. Wafer 100 includes multiple reticles 101. The reticles 101 are transferred to wafer 100 by exposing wafer 100 to an ultraviolet light source through a mask (not shown). After performing a full field exposure of the entire wafer through a mask, positional offsets 102 are performed. The positional offsets 102 aid exposing corner edges 103 of the die after first exposing the entire wafer 100. Each positional offset 102 exposes, for example, a two-by-two section of reticles 101 at a time, as illustrated on the right-hand side of FIG. 1. It should be understood, however, that any section of reticles 101 may be exposed at a given time.

Figure 2A:
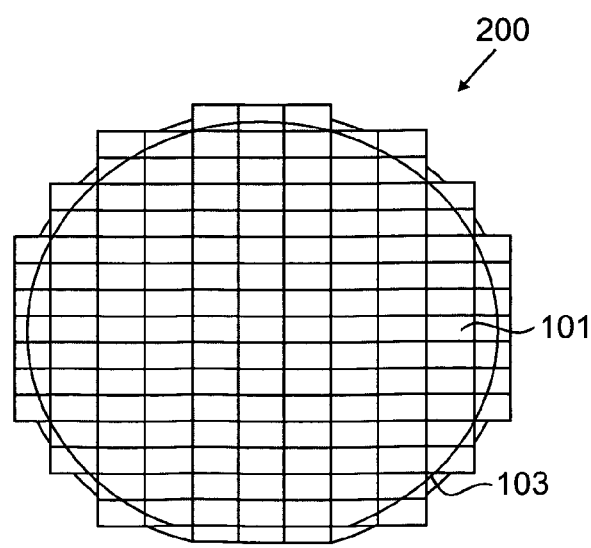
FIG. 2A depicts a coated wafer with mask image in accordance with one embodiment of the present disclosure.

FIG. 2A depicts a coated wafer 200 with a mask image in accordance with one embodiment of the present disclosure. In contrast with prior art systems, wafer 200 includes a double photoresist layer. Wafer 200 experiences increased yields, especially on edge 103 of wafer 200, by employing a baked photoresist as a hard mask in accordance with an embodiment of the present disclosure. Wafer 200 preferably includes a dual photoresist layer formed by method 300 described below.

Figure 2B:
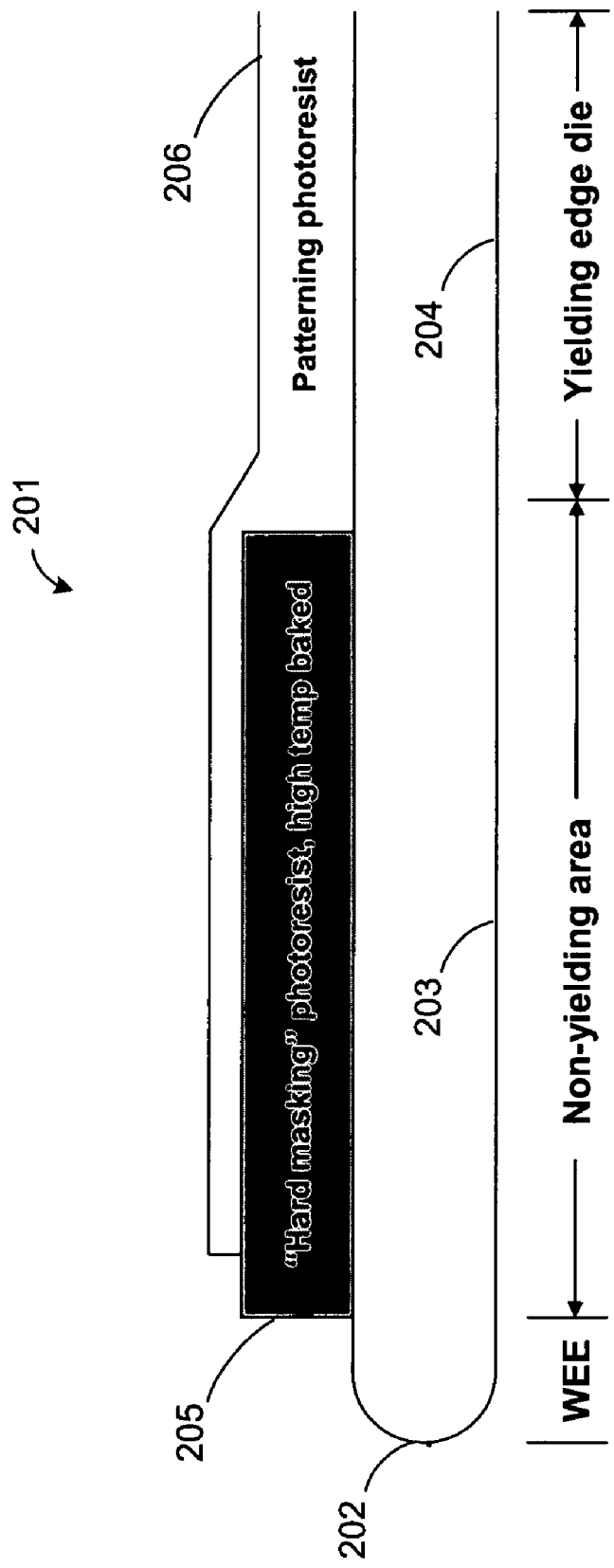
FIG. 2B is a simplified cross-sectional view of a photoresist layer remaining after the wafer is developed.

FIG. 2B is a simplified cross-sectional view of an exemplary photoresist layer 201 remaining after wafer 200 is developed. Wafer 200 includes a wafer edge exposure (WEE) end 202, a non-yielding area 203 and yielding edge die 204. Photoresist layer 201 includes a "hard masking" photoresist layer 205 and "patterning" photoresist layer 206.

Figure 3:
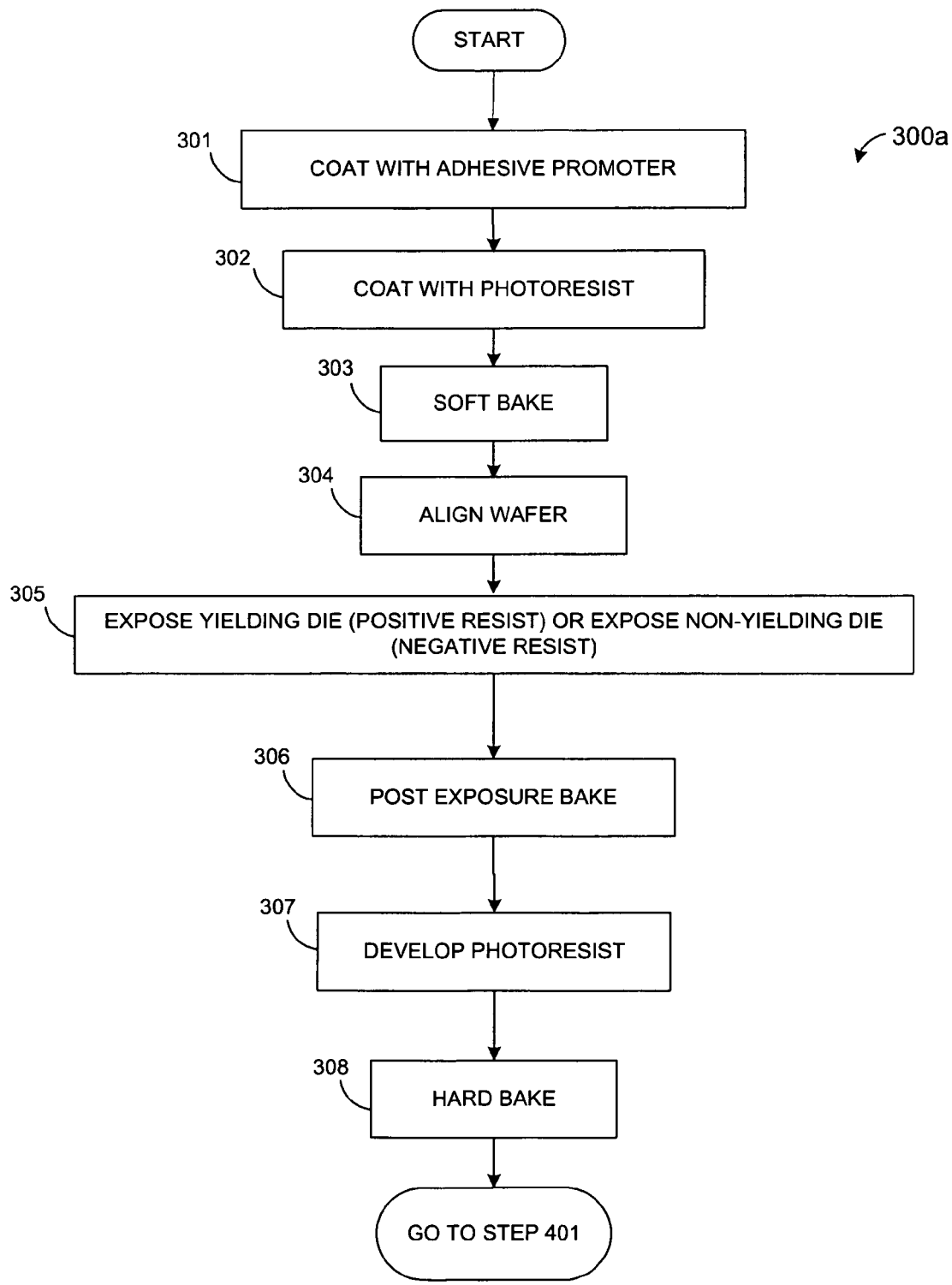
FIG. 3 is a somewhat simplified flow chart illustrating a first phase of a method for coating a wafer in accordance with one embodiment of the present disclosure.
Figure 4:
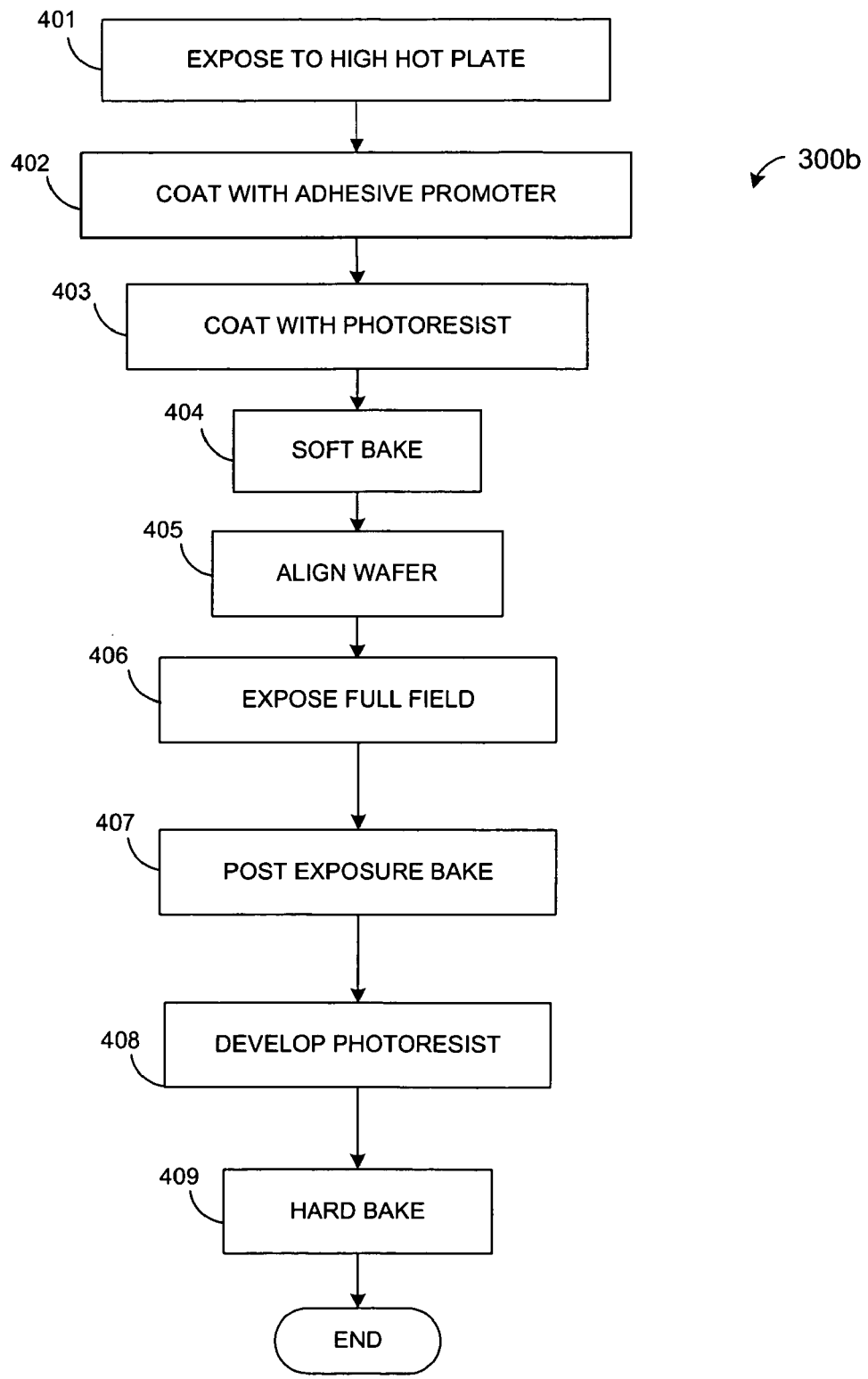
FIG. 4 is a somewhat simplified flow chart illustrating a second phase of a method for coating a wafer with a second photoresist layer in accordance with one embodiment of the present disclosure.

FIGS. 3 and 4 are somewhat simplified flow charts illustrating methods 300a and 300b (collectively sometimes referred to herein as method 300) of baking a dual photoresist layer or hard mask during lithography on a wafer, such as wafer 200.

In accordance with one embodiment of the present disclosure, a wafer is coated with an adhesion promoter to aid in adhering a resist, photosensitive polymer or photoresist to the wafer in step 301. Preferably, the wafer is coated with the adhesion promoter in an ambient temperature of 150 degrees Celcius for about 50 seconds. In step 302, the wafer is coated with the photoresist. Preferably, the photoresist is uniformly coated onto the wafer by a spinning or spraying process known in the art. The photoresist preferably protects the underlying material during processing or etching. According to one embodiment of the present disclosure, the photoresist may be, for example, an i-line resistance coating. Although the description primarily describes a photoresist, any suitable resist material may be used in accordance with the present disclosure.

Method 300a continues in step 303 by driving off some of the solvent in the photoresist by soft baking the wafer. Preferably, after coating the areas with a resistance coating, the wafer is baked in a high temperature sufficient to drive out any solvent from the resistance coating on the wafer. Preferably, the wafer is soft baked at about 90 degrees Celsius for about 80 seconds. According to one embodiment of the present disclosure, the wafer may be soft baked on a vacuum hot plate to optimize the light absorbance characteristics of the photoresist. Although the photoresist may lose mass or experience decreased thickness on the wafer surface, the photoresist preferably becomes more viscous.

In step 304, the wafer is aligned with the mask and prepared for exposure to ultraviolet light in step 305. Preferably, the exposure to ultraviolet light in step 305 is sufficient to cause selective chemical property changes on the surface of the resistance coating using a standard process such as an I7010 12K process. For example, method 300 preferably activates the photo-sensitive components of the resistance coating resulting in adequate line-width resolution and overlay accuracy, while maintaining a surface relatively free of particles and defects.

The wafer is preferably moved in the X- and Y-directions so that patterns or "shots" may be exposed onto the reticle. After performing a full field exposure of the entire wafer through a mask in step 305, positional offsets aid in filling in corner edges of the die. Each positional offset preferably exposes, for example, certain sections of reticles at a given time (preferably 7 mm at a time).

After exposure to ultraviolet light, the photoresist surface is then baked in step 306. Preferably, the photoresist surface is baked immediately after exposure to the ultraviolet light and at a temperature between about 110 degrees Celsius for about 60 seconds. A photoresist developer dissolves soluble areas of the photoresist and visible pattern begin to appear on the wafer in step 307. The developer may be either a positive resist or a negative resist photoresist polymer and may be a wet or dry process. Preferably, the visible pattern exhibits adequate quality measures such as, sufficient line resolution and uniformity, while maintaining a surface relatively free of particles and defects.

Method 300a continues in step 308, the wafer is subjected to a post-development thermal bake or hard bake. The hard bake preferably evaporates the remaining solvent in the photoresist and improves the resist-to-wafer adhesion. Preferably, the hard bake occurs at about 100 degrees Celsius for about 50 seconds. Finally, the wafer is placed on a transition chill plate. Preferably, the wafer is placed onto a chill plate at a temperature of about 23 degrees Celsius for about 20 seconds. Method 300a continues method 300b.

Now referring to FIG. 4, method 300b begins by exposing the wafer resulting in step 320 to a high hot plate in step 401 to dehydrate the wafer to later aid in adhering a photoresist to the wafer and to ensure that the surface of the wafer is dry and clean. Preferably, the wafer is exposed to a high hot plate set at about 225 degrees Celsius for about 52 seconds. In one embodiment of the present disclosure, a hexamethyldisilazane or HMDS hot plate may be used.

In step 402, the wafer is coated with an adhesion promoter to further aid in adhering the photoresist to the wafer. Preferably, the wafer is coated with an adhesion in an ambient of about 180 degrees Celsius for about 57 seconds. Then, in step 403, the wafer is coated with the photoresist. Preferably, the photoresist is uniformly coated onto the wafer by a spinning or spraying process known in the art. The photoresist preferably protects the underlying material during processing or etching. According to one embodiment of the present disclosure, the photoresist is preferably an i-line resistance coating. Although the description primarily describes a photoresist, any suitable resist material may be used.

Method 300b continues in step 404 by driving off some of the solvent in the photoresist, the wafer is then soft baked. Preferably, after coating the areas with an i-line resistance coating, the wafer is baked in a high temperature sufficient to drive out any solvent from the i-line resistance coating on the wafer. Preferably, the wafer is baked in an ambient temperature of 105 degrees for about 60 seconds. According to one embodiment of the present disclosure, the wafer may be soft baked on a vacuum hot plate to optimize the light absorbance characteristics of the photoresist. Although the photoresist may lose mass or decreased thickness on the wafer surface, the photoresist preferably becomes more viscous. At this stage of method 300b, the wafer is now coated with two layers of photoresist material in accordance with one embodiment of the present disclosure.

In step 405, the wafer is aligned with the mask and prepared for exposure to ultraviolet light in step 406. Once aligned, the wafer is preferably moved in the X- and Y-directions so that patterns or "shots" may be exposed onto the reticle. Preferably, the exposure to ultraviolet light in step 406 is sufficient to cause selective chemical property changes on the surface of the i-line resistance coating using a standard deep ultraviolet (DUV) process such as 12.0 DUV. In accordance with the present disclosure, the DUV process is preferably conducted without leveling over areas of the wafer 200 which contain double resist coatings. For example, method 300b preferably activates the photo-sensitive components of the i-line resistance coating resulting in adequate line-width resolution and overlay accuracy, while maintaining a surface relatively free of particles and defects. In addition, the wafer edges are exposed to ultraviolet light.

After exposure to ultraviolet light, the photoresist surface is then baked in step 407. Preferably, the photoresist surface is baked immediately after exposure to the ultraviolet light and at a temperature between about 100 degrees Celsius for about 60 seconds. A photoresist developer dissolves soluble areas of the photoresist and visible pattern begin to appear on the wafer in step 408. The developer may be either a positive resist or a negative resist photoresist polymer and may be a wet or dry process. Preferably, the visible pattern exhibits adequate quality measures such as, sufficient line resolution and uniformity, while maintaining a surface relatively free of particles and defects.

Finally, in step 409, the wafer is subjected to a post-development thermal bake or hard bake. The hard bake preferably evaporates the remaining solvent in the photoresist and improves the resist-to-wafer adhesion. Preferably, the hard bake in step 409 occurs at even higher temperatures than the soft bake in step 407, or about 110 degrees Celsius for about 60 seconds. The wafer may be etched using contact printing, proximity printing or projection printing at any suitable time during method 300. Accordingly, method 300 is a method of making a double resist coated or baked photoresist hard mask in accordance with one embodiment of the present disclosure. It should be understood that the dual layer hard mask may be made of two different types of resists or may have any number of layers of resists.

In accordance with an embodiment of the present disclosure, a standard DUV process is disclosed which contains a double resist coating or a baked photoresist hard mask. The cycle times and number of shots required are lower than that of the prior art, while still addressing other problems such as edge focus or photo throughput. Speed, yield, cost of manufacturing, cost of human resources and maintenance of critical layer imaging is improved without employing more expensive equipment, such as high-end scanners. The process of selective imaging in accordance with the present disclosure is useful for wafer edge imaging as well as patterning different layer formations onto the same substrate or on multiple layers with different photoresists on the same film stack without performing multiple etches.

The embodiments and examples set forth herein are presented to best explain the present disclosure and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method of selectively hard masking a semiconductor wafer, the method comprising:
   coating a surface of the wafer with a first resist;
   baking the wafer to sufficiently drive out solvents in the first resist;
   transferring reticles to the wafer by exposing the first resist to a radiation source through a mask at a first position using a first process;
   transferring a section of the reticles to an edge of the wafer, that was unexposed to the radiation source during the first process, by exposing the unexposed edge of the wafer having the first resist disposed thereon to the radiation source through the mask at a positional offset of the first position;
   removing areas of the first resist;
   hard baking the first resist to the wafer;
   exposing the wafer to a high hot plate at a higher temperature than hard baking the first resist after the wafer has been cooled down to dehydrate the wafer;
   coating the first resist with a second resist, wherein the second resist forms a layer on the wafer and a first portion of the layer comprising the second resist is in contact with and above at least a portion of the first resist and a second portion of the layer comprising the second resist is in contact with the surface of the wafer;
   baking the wafer to sufficiently drive out solvents in the second resist;
   exposing the second resist to the radiation source without leveling over areas of the wafer that include a portion of the layer comprising the second resist above the first resist using a second process that is different from the first process to create a patterning resist portion in the layer comprising the second resist; and
   hard baking the second resist to the wafer to create a hard masking resist portion at the edge of the wafer that was unexposed by the exposure to the radiation source.

2. The method of claim 1, wherein the second resist is a photoresist.

3. The method of claim 1, wherein the second resist is an i-line resist and wherein exposing the second resist to the radiation source comprises:
   activating photo-sensitive components of the i-line resist to control line-width resolution to create the patterning resist portion without leveling over areas of the wafer that include the layer of the second resist over the first resist.

4. The method of claim 1, wherein the radiation source is an ultraviolet light source.

5. The method of claim 1, wherein the first process comprises an I7010 12K process, and the second process comprises a deep ultraviolet process.

6. The method of claim 1, wherein the high hot plate is a hexamethyldisilazane hot plate.

7. The method of claim 1, wherein the first resist and the second resist selectively form a double resist layer on a portion of the wafer.

8. The method of claim 1, further comprising:
exposing the first resist to a developer.

9. The method of claim 1, wherein baking the wafer to sufficiently drive out solvents in the first resist comprises:
soft baking the wafer on a vacuum hot plate to improve light absorbance characteristics of the first resist.

10. For use in a semiconductor wafer, a method of selective imaging through a dual photoresist layer, the method comprising:
coating a surface of the wafer with a resist;
baking the wafer to sufficiently drive out solvents in the resist;
transferring reticles to the wafer by exposing the resist to a radiation source through a mask at a first position using a first process;
transferring a section of the reticles to an edge of the wafer, that was unexposed to the radiation source during the first process, by exposing the unexposed edge of the wafer having the resist disposed thereon to the radiation source through the mask at a positional offset of the first position;
removing areas of the first resist;
hard baking the resist to the wafer;
exposing the wafer to a high hot plate at a higher temperature than hard baking the first resist after the wafer has been cooled down to dehydrate the wafer;
coating the resist with a photosensitive polymer different from the resist, wherein the photosensitive polymer forms a layer on the wafer and a first portion of the layer comprising the photosensitive polymer is in contact with and above at least a portion of the resist a second portion of the layer comprising the photosensitive polymer is in contact with the surface of the wafer;
baking the wafer to sufficiently drive out solvents in the photosensitive polymer;
exposing the photosensitive polymer to the radiation source without leveling over areas of the wafer that include a portion of the layer comprising the photosensitive polymer above the resist using a second process that is different from the first process to create a patterning resist portion in the layer comprising the photosensitive polymer; and
hard baking the photosensitive polymer to the wafer to create a hard masking resist portion at the edge of the wafer that was unexposed by the exposure to the radiation source.

11. The method of claim 10, wherein the photosensitive polymer is an i-line resist and wherein exposing the photosensitive polymer to the radiation source comprises:
activating photo-sensitive components of the i-line resist to control line-width resolution to create the patterning resist portion without leveling over areas of the wafer that include the layer of the photosensitive polymer over the resist.

12. The method of claim 10, wherein the first process comprises an I7010 12K process, and the second process comprises a deep ultraviolet process.

13. The method of claim 10, wherein the resist and the photosensitive polymer selectively form a double resist layer on a portion of the wafer.

14. The method of claim 10, further comprising:
exposing the resist to a developer.

15. The method of claim 10, further comprising:
exposing the photosensitive polymer to a developer.

16. A method of selectively hard masking a semiconductor wafer, the method comprising:
coating a surface of the wafer with a first resist;
baking the wafer to sufficiently drive out solvents in the first resist;
transferring reticles to the wafer by exposing the first resist to a radiation source through a mask at a first position using a first process;
transferring a section of the reticles to an edge of the wafer, that was unexposed to the radiation source during the first process, by exposing the unexposed edge of the wafer having the first resist disposed thereon to the radiation source through the mask at a positional offset of the first position;
removing areas of the first resist;
hard baking the first resist to the wafer;
exposing the wafer to a high hot plate at a higher temperature than hard baking the first resist after the wafer has been cooled down to dehydrate the wafer;
coating the first resist with a second resist, wherein the second resist forms a layer on the wafer and a first portion of the layer comprising the second resist is in contact with and above at least a portion of the first resist and a second portion of the layer comprising the second resist is in contact with the surface of the wafer;
creating a patterning resist portion by exposing the wafer to the radiation source without leveling over areas of the wafer that include a portion of the layer comprising the second resist above the first resist using a second process that is different from the first process in the layer comprising the second resist; and
hard baking the second resist to the wafer such that a hard masking resist portion is created at the edge of the wafer that was unexposed by the exposure to the radiation source.

17. The method of claim 16, further comprising:
baking the wafer to sufficiently drive out solvents in the second resist, wherein the second resist is different from the first resist, and at least a portion of the second resist is in contact with at least a portion of the first resist.

18. The method of claim 17, wherein the second resist is a photoresist.

19. The method of claim 17, wherein the second resist is an i-line resist and wherein exposing the second resist to the radiation source comprises:
activating photo-sensitive components of the i-line resist to control line-width resolution to create the patterning resist portion without leveling over areas of the wafer that include the layer of the second resist over the layer of the first resist.

20. The method of claim 17, wherein the radiation source is an ultraviolet light source.

* * * * *